United States Patent [19]
Johnson

[11] Patent Number: 5,686,840
[45] Date of Patent: Nov. 11, 1997

[54] METHOD AND APPARATUS FOR THROTTLE POSITION SENSOR TESTING

[75] Inventor: Arthur D. Johnson, Muskego, Wis.

[73] Assignee: Automotive Controls Corporation, Branford, Conn.

[21] Appl. No.: 646,601

[22] Filed: May 8, 1996

[51] Int. Cl.$^6$ .................................................. G01R 31/02
[52] U.S. Cl. .......................... 324/556; 324/542; 340/653
[58] Field of Search .................................... 324/556, 538, 324/503, 542, 539; 340/653, 654, 660; 320/48

[56] References Cited

U.S. PATENT DOCUMENTS

| | | |
|---|---|---|
| 3,532,967 | 10/1970 | Milton et al. . |
| 4,155,036 | 5/1979 | Nicholson . |
| 4,488,147 | 12/1984 | Signorile . |
| 4,567,756 | 2/1986 | Colborn . |
| 4,626,633 | 12/1986 | Ruehl et al. . |
| 4,633,167 | 12/1986 | Kitts . |
| 4,814,693 | 3/1989 | Coben . |
| 4,929,887 | 5/1990 | Robitaille et al. . |
| 5,168,238 | 12/1992 | Larance . |
| 5,177,447 | 1/1993 | Marino et al. . |
| 5,208,543 | 5/1993 | Albiniak . |
| 5,214,582 | 5/1993 | Gray . |
| 5,285,163 | 2/1994 | Liotta . |
| 5,359,290 | 10/1994 | Cervas . |

Primary Examiner—Christine K. Oda
Attorney, Agent, or Firm—St. Onge Steward Johnston & Reens

[57] ABSTRACT

A harness for testing a throttle position sensor having wires operatively connected therein terminating in a connector. The harness comprises a card and a first cable of multiple wires hard-wired to the card at one end and terminating in a connector at the other. The connector of the first cable is removably connectable to the throttle position sensor connector. The card further comprises a second cable of multiple wires hard-wired to the card at one end and operably attached to a connector at another end. The connector of the second cable is a mate for the connector of the first cable. At least two terminals are mounted on the card and connected between the wires of the first and second cables for connecting the card to a digital volt/ohm meter. A light is mounted on the card and connected between wires of the first and second cables to determine and visually indicate the continuity of the throttle position sensor wires. In another preferred embodiment, the first cable comprises a plurality of other ends. Each of the other ends of the first cable terminates in a different connector, wherein each of the different connectors of the first cable is removably connectable to a different throttle position sensor connector. The second cable also comprises a plurality of other ends. Each of the other ends of the second cable terminates in and is attached to a different connector, each being a mate for the connectors of the first cable.

23 Claims, 3 Drawing Sheets

METHOD AND APPARATUS FOR THROTTLE POSITION SENSOR TESTING

FIELD OF THE INVENTION

The invention relates to test harnesses and test methods used with the test harnesses for determining the continuity of the wiring of a throttle position sensor in a vehicle and whether the proper voltage is received by the throttle position sensor.

BACKGROUND OF THE INVENTION

Diagnosing vehicle malfunctions has become increasingly difficult with the advent of computer-controlled vehicle engines. This is particularly true of determining malfunctions associated with a throttle position sensor. As is known, the throttle position sensor is connected via a removable wire harness to a vehicle electronic control system. Thus, throttle position sensor malfunctions may be caused by any of the following possibilities and/or combinations thereof: faulty wire harness connectors; faulty wiring; throttle position sensor malfunction; and/or vehicle electronic control system computer malfunction.

Diagnosing the malfunction is further complicated by the fact that the behavior of the malfunction provides little, if any, information about where in the system the malfunction exists. Thus, a technician is required to isolate each of the aforementioned possibilities and determine which is the source of the malfunction.

When evaluating a malfunctioning throttle position sensor, a technician generally first determines the components of the wiring harness. That is, the technician must determine which of the leads of the wire harness is the supply voltage line, the reference voltage line and ground. Each of the locations of the components of the wire harness may vary by vehicle, engine and model year, and the differing locations are usually too numerous for one to remember.

Next, to establish where the fault exists, a technician is required to use makeshift clips/probes to interface a system test unit with the different pins/sockets of the wire harness. Many potential problems may arise when doing so. For example, the pins/sockets of the wire harness may be damaged by a forced or other less than ideal connection, or the engine computer circuit may be damaged if the wires are improperly crossed or grounded. Thus, the technician must exercise extreme caution, causing the time associated with the task to become undesirably long.

U.S. Pat. No. 4,567,756 to Colborn discloses an engine control systems analyzer comprising a basic test switching control box connectable to a volt/ohm meter. The control box may be used for testing throttle position sensors. The control box includes a plug receptacle (56) and a multi-pin connector (59) and is adaptable from vehicle to vehicle locating and attaching the proper cable connecting the control box receptacle and/or connector with each different make and model of a car.

Several disadvantages are associated with the removable connecting cable test unit of the Colborn '756 patented device. It comprises rather complicated circuitry, which can be expensive to manufacture. Further, receptacle (56) and/or connector (59) may become worn and/or damaged with repeated removal and insertion of the appropriate wire harness(es) for a particular vehicle.

Devices for testing vehicle circuits and components for functions other than throttle position sensing are also known. U.S. Pat. No. 5,168,238 to Larance discloses a circuit tester for vehicle fuel injectors. The tester comprises a housing (12) having a pair of electrical circuit connection cables (14, 16) extending from opposed ends thereof. A magnifying assembly can be removably mounted on the housing permitting a user to view the illumination of the L.E.D.s from a distance.

U.S. Pat. No. 5,208,543 to Albiniak discloses a tester for power-operated vehicle antennas. The tester includes first and second harnesses (30, 32) which extend outwardly from housing (34). A fiber optic cable can be utilized for remote viewing of illuminated diodes.

Neither Larance nor Albiniak disclose volt/ohm meters or connectors therefore for testing throttle position sensors.

What is desired, therefore, is a test harness which facilitates diagnosing throttle position sensing malfunctions, which utilizes simple circuitry and is therefore inexpensive to manufacture, which is not subjected to the wear associated with repeated insertion and removal of different wire harnesses for each different vehicle, and which includes connectors that can be utilized with any standard digital volt/ohm meter.

SUMMARY OF THE INVENTION

Accordingly, it is an object of the present invention to provide a test harness which facilitates diagnosing throttle position sensor malfunctions.

It is another object of the present invention to provide a throttle position test harness which is not subjected to the wear associated with repeated insertions and removals of different wire harnesses for different vehicles.

It is still a further object of the present invention to provide a throttle position sensor test harness which contains circuitry that is relatively simple and inexpensive to manufacture.

It is still another object of the present invention to provide a throttle position sensor test harness which includes connectors that can be used with any standard digital volt/ohm meter.

It is yet another object of the present invention to provide a method of using a throttle position sensor test harness having the above characteristics for diagnosing malfunctions of a throttle position sensor.

These and other objects and advantages are achieved by provision of a throttle position sensor (t.p.s.) test harness which comprises: a card; a first cable of multiple wires having at least two ends, one end being hard-wired to the card and another end terminating in and operably attached to a connector; and a second cable of multiple wires having at least two ends, one end being hard-wired to the card and another end terminating in and operably attached to a connector. The connector of the first cable is sized and shaped to be removably connectable to the throttle position sensor connector. The connector of the second cable is, preferably, a mate for the connector of the first cable and sized and shaped to be connectable to an electronic control unit wire harness connector.

At least two terminals are mounted on the card and electrically and operably connected between wires of the first and second cables for connecting the card to a digital volt/ohm meter. A light or light emitting diode (L.E.D.) is mounted on the card and electrically and operably connected between wires of the first and second cables to determine and visually indicate whether the electronic control unit is sending the proper voltage to the throttle position sensor through the electronic control unit wire harness, or, in other words, whether the proper voltage is being received by the t.p.s. For example, if there were a malfunction with the electronic control unit or if the electronic control unit were inoperative, then the L.E.D. would not turn on.

In another preferred embodiment, the first cable comprises a plurality of other ends opposite the end hard-wired to the card. Each of the other ends terminates in and is operably attached to a different connector. Notably, each of the different connectors of the first cable is sized and shaped to be removably connectable to a different throttle position sensor. Similarly, the second cable comprises a plurality of other ends opposite the end hard-wired to the card. Each of the other ends terminates in and is operably attached to a different connector. Each of the different connectors of the second cable is sized and shaped to be mated with only one of the different connectors of the first cable and is connectable to a connector of an electronic control unit wire harness.

The invention and its particular features and advantages will become more apparent from the following detailed description when considered with reference to the accompanying drawings.

DETAILED DESCRIPTION OF THE DRAWINGS

Figure 1:
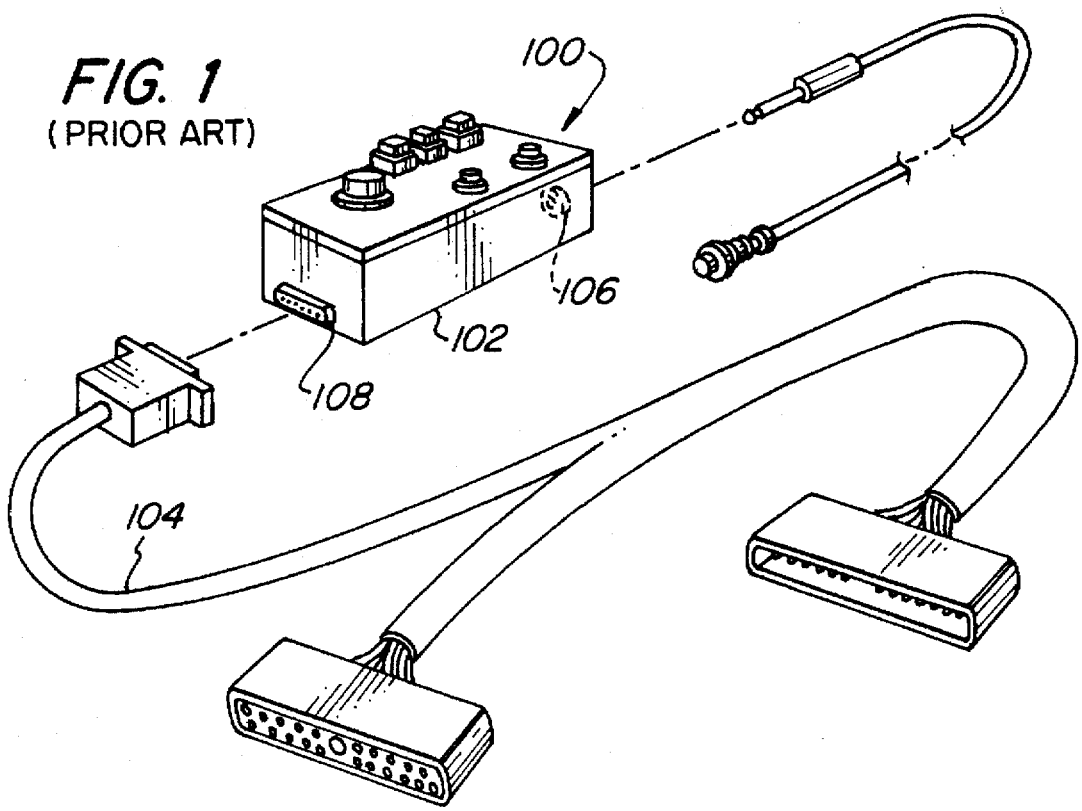
FIG. 1 is an exploded, isometric view of a prior art test unit having cables removably attached thereto.

Referring to FIGS. 2–5 in detail, a throttle position sensor test harness is shown and generally designated by the reference numeral 10. It should be noted that for the sake of clarity all the components and parts of test harness 10 may not be shown and/or marked in all the drawings. As used in this description, the terms "up", "down", "top", "bottom", etc. refer to test harness 10 when in the orientation illustrated in FIG. 2, although it should be recognized that test harness 10 may be in any of various orientations when in use, the orientation illustrated in FIG. 2 not being necessary for operability.

Figure 2:
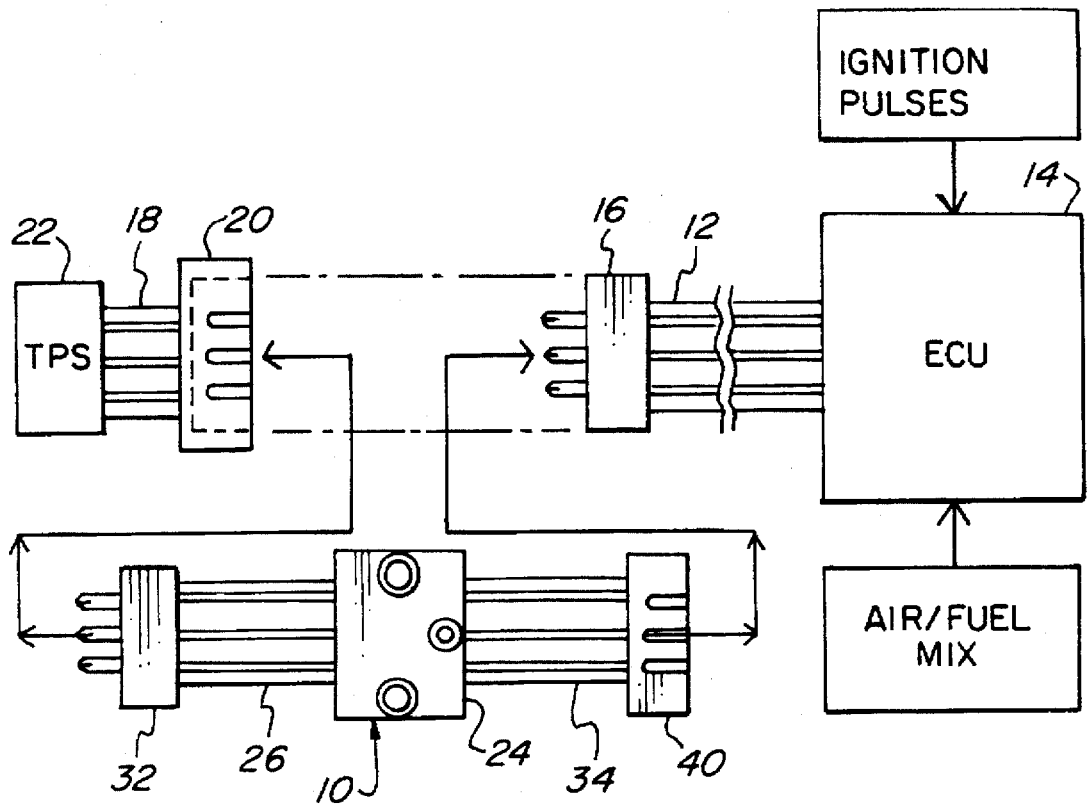
FIG. 2 is an exploded, schematic view of a throttle position sensor test harness, constructed in accordance with the present invention, insertable between a throttle position sensor connector and a wire harness connector.

Referring to FIG. 2, a conventional car (not shown) comprises an electrical harness 12 extending from the car's electronic control unit 14. Harness 12 terminates in connector 16 in a known manner. Harness 12 is connectable to a second electrical cable 18 through mating connector 20. Cable 18 is attached in a manner known in the art to the car's throttle position sensor 22.

Test harness 10, when in use, is operably connected between connector 20 of the throttle position sensor 22 and connector 16 of electronic control unit 14.

It should be understood that the complete assembly, wherein connector 20 of cable 18 is connected to connector 16 of harness 12, is a conventional and well known construction and constitutes no part of the present invention. Rather, the present invention is directed to a test harness 10 which is removably insertable between the connector 20 of cable 18 and connector 16 of harness 12, in the manner shown by the arrows in FIG. 2, for testing whether proper voltage is received by the throttle position sensor.

Figure 5:
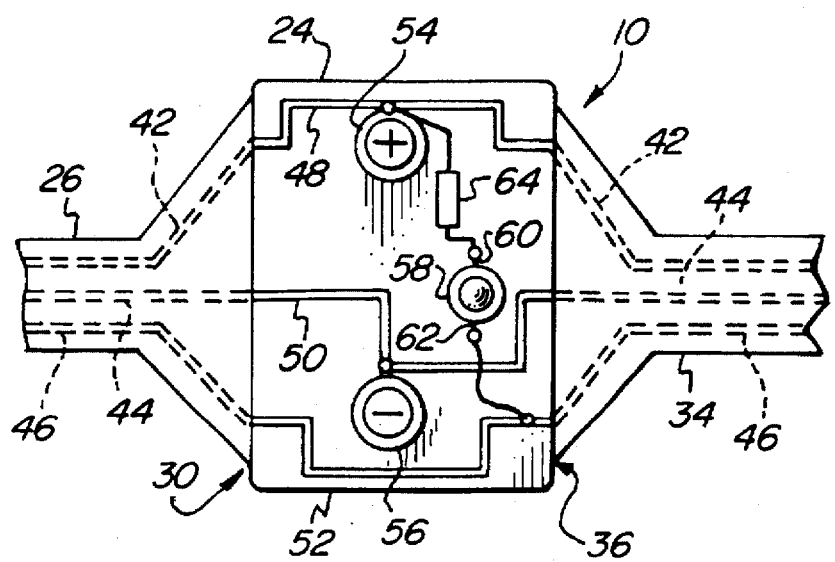
FIG. 5 is a top view of the throttle position sensor test harness shown in FIG. 2.

As best shown in FIG. 5, test harness 10, sometimes referred to herein as a dual-end test harness, comprises card 24. Card 24 may be made of any suitable material such as plastic. Card 24 is relatively small, when compared to test units of the prior art. In the preferred embodiment, card 24 is about 1¾" wide, 1⅜" long and about ¾" deep.

Referring to FIGS. 2–5, test harness 10 further comprises a first cable 26 having at least two opposing ends 28, 30. End 30 is hard-wired to card 24 and end 28 terminates in and is operably attached to connector 32. Connector 32 of first cable 26 is sized and shaped to be removably connectable to throttle position sensor connector 20 (FIG. 2).

Connector 32 may be any suitable connector known in the art, so long as a sufficient electrical connection is made with connector 20 of the throttle position sensor 22. Suitable connectors include plug-type connectors, receptacle-type connectors, or multi-pin connectors. In the preferred embodiment, as shown in FIGS. 2–5, connector 32 of first cable 26 is that of a female-type connector, or plug-type.

Figure 3:
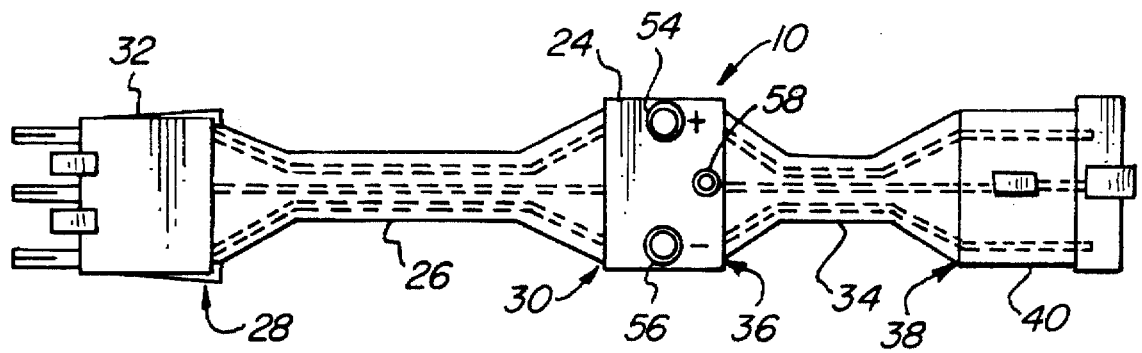
FIG. 3 is a top plan view of the throttle position sensor test harness shown in FIG. 2.
Figure 4:
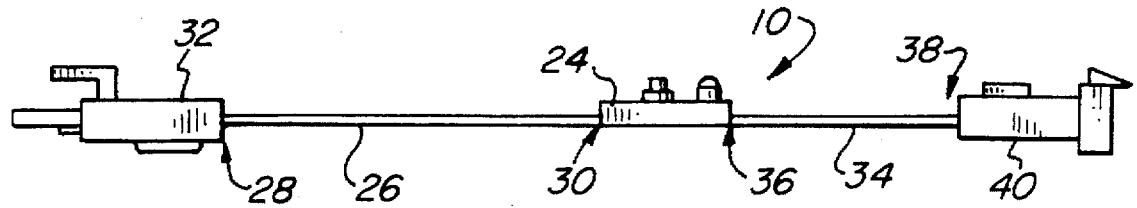
FIG. 4 is a side view of the throttle position sensor test harness shown in FIG. 3.

Again referring to FIGS. 2–5, dual-end test harness 10 further comprises a second cable 34 positioned opposite first cable 26 on card 24. Second cable 34 has at least two opposing ends 36, 38. As best shown in FIGS. 3, 4, end 36 is hard-wired to card 24 and end 38 terminates in and is operably attached to connector 40. Connector 40 of second cable 34 is a mate for connector 32 of first cable 26.

Connector 40 may be any suitable connector known in the art, so long as a sufficient electrical connection is made with the connector 16 of the electronic control unit 14. Suitable connectors include plug-type connectors, receptacle-type connectors, or multi-pin connectors. In the preferred embodiment, connector 40 of second cable 34 is that of a male connector, or receptacle-type.

As best shown in FIG. 5, both cables 26, 34 comprise multiple wires therein. More specifically, each cable 26, 34 comprises a supply voltage line 42, a reference voltage line 44 and a ground line 46. Continuity is provided between cables 26, 34 by provision of corresponding lines over card 24. That is, line 48 on card 24 is a supply voltage line, line 50 is a reference voltage line, and line 52 is ground. Supply voltage line 42 typically supplies a continuous predetermined amount of voltage, such as about 12 volts. Each of the multiple wires 42, 44, 46 may be made of any suitable material known in the art, but are most preferably made of 18 gauge flex wire.

Referring again to FIG. 5, at least two terminals 54, 56 are mounted on card 24 and are electrically and operably connected between wires of the first and second cables 26, 34, respectively, for connecting card 24 to a digital volt/ohm meter (not shown). As shown in FIGS. 3, 5, one terminal, such as 54, is labeled positive and one terminal, such as 56, is labeled negative. One terminal, for example the positive terminal 54, is operably and electrically connected to supply voltage line 48. The other terminal, the negative terminal 56, for example, is operably and electrically connected to reference voltage line 52.

Test harness 10 further comprises light 58, which is mounted on card 24 and electrically and operably connected between wires of the first and second cables 26, 34 to determine and visually indicate whether the electronic control unit is sending the proper voltage to the throttle position sensor. Light 58 can be any suitable visual indicator such as a light emitting diode (L.E.D.), commonly known in the art. Light emitting diode 58 has anode 60 and cathode 62. Resistor 64 of about 150 ohm, ¼ watt is connected at one end to the supply voltage line 48 and at the other end to the anode 60 of L.E.D. 58. Cathode 62 of L.E.D. 58 is connected to ground 52.

Figure 6:
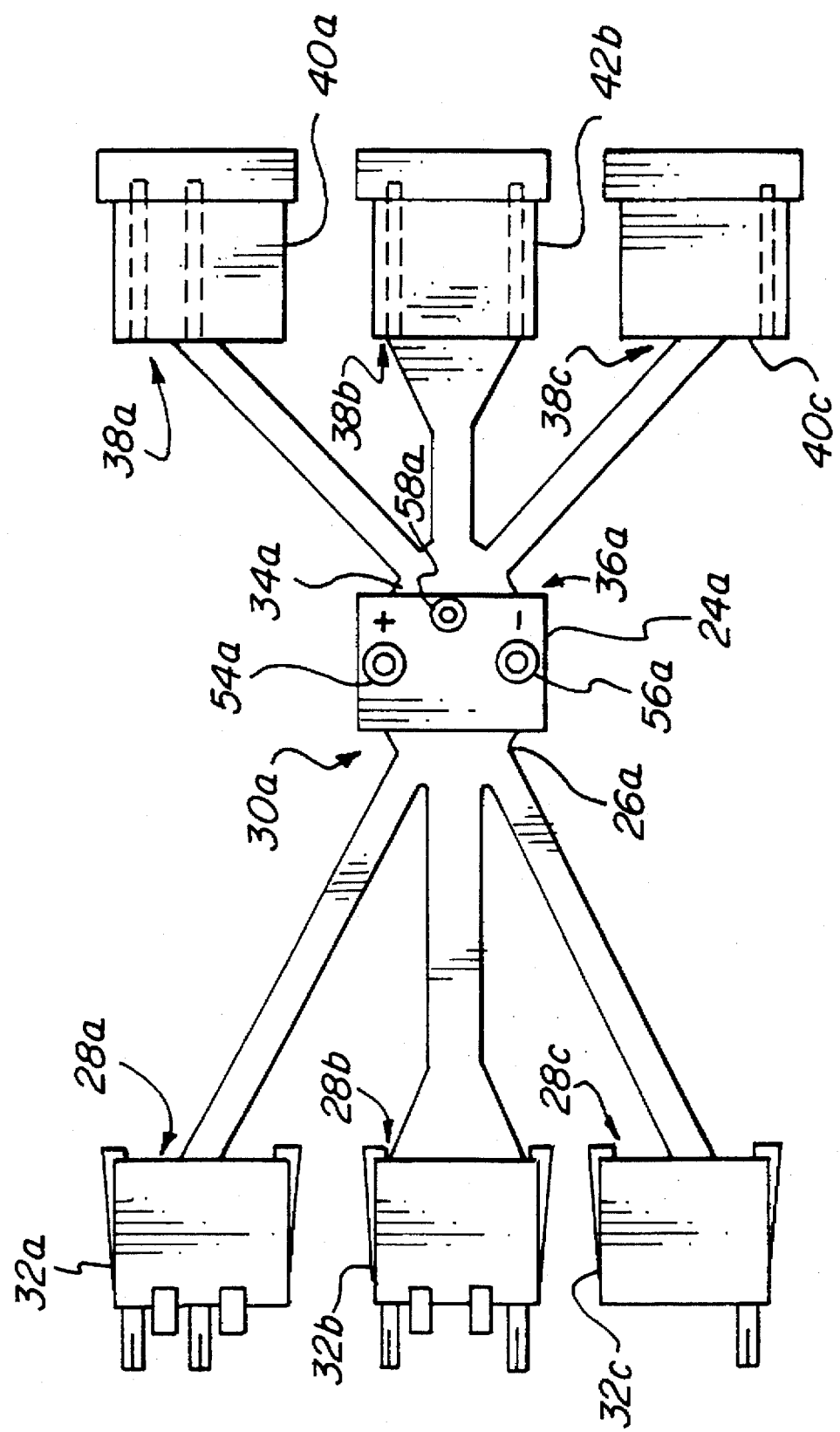
FIG. 6 is a top view of a multi-end throttle position sensor test harness.

As shown in FIG. 6, another preferred embodiment is referred to herein as the multi-end wire harness and is generally designated by the reference numeral 10a. The construction of multi-end wire harness 10a is substantially identical to the construction of dual-end wire harness 10, wherein like elements are identified with like numerals having a letter suffix, the exception residing in the construction of the ends of the first and second cables 26a, 34a. First cable 26a has one end 30a hard-wired to card 24a and a plurality of other ends 28a, 28b, 28c, for example. Each of the other ends 28a, 28b, 28c terminates in and is operably attached to a different connector 32a, 32b, 32c. Each of the different connectors 32a, 32b, 32c of the first cable 26a is sized and shaped to be removably connectable to a different connector 20 of a throttle position sensor, such as 22 (FIG. 2).

Referring again to FIG. 6, second cable 34a has one end hard-wired to card 24a and a plurality of other ends 38a, 38b, 38c, for example. Each of the other ends 38a, 38b, 38c terminates in and is operably attached to a different connector 40a, 40b, 40c.

Each of the different connectors 40a, 40b, 40c of second cable 34a is sized and shaped to be mated with only one of the different connectors 32a, 32b, 32c of first cable 26a. For example, connector 32a of first cable 26a is a mate for connector 40a of second cable 34a. Similarly, connector 32b is a mate for connector 40b, and connector 32c is a mate for connector 40c.

It should be understood that cables 26a and 34a could have as many ends and connectors as desirable. Three connectors on each end have been shown for purposes of illustration only and is not intended to be limiting.

It should be further understood that multi-end wire harness 10a comprises at least two terminals 54a, 56a mounted on card 24a and electrically connected between wires of the first and second cables for connecting the card to a digital volt/ohm meter, in the same manner as discussed earlier regarding the dual-end test wire harness 10.

It should still further be understood that card 24a comprises light 58a mounted thereon and electrically connected between wires of first and second cables 26a, 34a for determining and visually indicating the continuity of the throttle position sensor wiring and whether proper voltage is received by the throttle position sensor, in a manner as discussed above.

Due to the conventional practices of car manufacturers, it is not uncommon for different makes and models of cars to have different throttle position sensor connectors, such as 20. See FIG. 2. Advantageously, because multi-end test harness 10a (FIG. 6) comprises a plurality of different connectors 32a, 32b, 32c, 40a, 40b, 40c, multi-end harness 10a may conveniently be used to test a variety of different throttle position sensors, without requiring the technician to switch test harnesses with each car. Therefore, the multi-end test harness 10a provides a labor saving and time saving method for testing the throttle position sensor of a variety of different cars.

A method for testing the dual-end test harness 10 in accordance with the present invention generally comprises the following steps. First, with the car's ignition off, a technician disconnects connector 20 of throttle position sensor 22 from connector 16 of electrical control unit 14. Second, the technician installs the test wire harness 10 by connecting connector 32 of first cable 26 to connector 20, and by connecting connector 40 of second cable 34 to connector 16. See FIG. 2.

After test harness 10 is properly connected, the technician turns on the car's ignition. If the green light 58 (FIGS. 3, 5) turns on, then the technician assumes that the electronic control unit 14 (FIG. 2) is sending the supply voltage properly to the throttle position sensor 22 and that the connections and wiring are satisfactory.

If L.E.D. 58 is off, then the technician checks the connections of the wire harness 10, and the connectors 20, 16 of the throttle position sensor and electronic control unit, 22, 14, respectively.

Next, the technician operably connects a digital volt/ohm meter to terminals 54, 56 on card 24, reads the start voltage and compares it to that indicated as acceptable by the manufacturer's specifications. If the displayed voltage amount is not within the manufacturer's recommended range, then it must be adjusted; otherwise, the engine performance could be less than desirable.

Afterwards, the technician conducts a sweep of the throttle position sensor 22. This is accomplished by moving the throttle from a closed position to a wide-open-throttle (W.O.T.) position, i.e., from about negative one volt to about five volts, depending on the make and model of the car and the manufacturer's recommendations. If the voltage as indicated by the digital volt/ohm meter varies linearly, then the technician may assume that the throttle position sensor 22 is working properly. If the voltage does not vary linearly, then the technician should assume that the throttle position sensor 22 is faulty and it must be replaced.

It should be understood that the manner and method of using multi-end test harness 10a is substantially as set forth above, with obvious modifications due to the multiple connectors 32a, 32b, 32c, 40a, 40b, 40c.

The present invention, therefore, provides a new and useful apparatus and method for testing the continuity of the wiring of a throttle position sensor and for determining whether the proper voltage is received by the throttle position sensor.

Thus, it is understood that test harness 10, 10a provides many advantages over the test analyzers of the prior art. For example, prior art device 100 (FIG. 1) comprises a basic test switching control box 102. It is adaptable from vehicle to vehicle via a removable cable 104. The prior art device 100 is, however, disadvantageous because of its complicated circuitry, which can be expensive and time consuming to manufacture and because receptacle 106 and/or connector 108, may become worn and/or damaged with the repeated removal and insertion of the appropriate harnesses.

Advantageously, test harness 10, 10a overcomes the drawbacks of the prior art device 100 by provision of cables 26, 34, 26a, 34a, respectively, which are hard-wired to card 24, 24a.

Another advantage resides in the simple circuitry of test harness 10, 10a. Test harness 10, 10a comprises supply voltage line 48, reference voltage line 50 and ground line 52. See FIG. 5. Two terminals 54, 56 and light 58 are operably connected therebetween, in the manner discussed above. Notably, this simple circuitry is all that is required to achieve a suitable test harness.

An additional advantage resides in the size of dual-end test harness 10. Harness 10 extends approximately 12–14", when measured from the tip of connector 32 to the tip of connector 40. Thus, harness 10 is relatively small, lightweight and easy to carry, when compared to some prior devices.

It should further be understood that the foregoing is illustrative and not limiting and that obvious modifications may be made by those skilled in the art without departing from the spirit of the invention. Accordingly, reference should be made primarily to the accompanying claims, rather than the foregoing specification, to determine the scope of the invention.

What is claimed is:

1. A harness for testing at least one throttle position sensor of a vehicle, the throttle position sensor having wires operatively connected therein terminating in a connector, the harness comprising:

a card;

a first cable of multiple wires having at least two ends, one end being hard-wired to the card and another end terminating in and operably attached to a connector, the connector of the first cable being sized and shaped to be removably connectable to the throttle position sensor connector;

a second cable of multiple wires having at least two ends, one end being hard-wired to the card and another end terminating in and operably attached to a connector, the connector of the second cable being a mate for the connector of the first cable, the connector of the second cable being removably connectable to a connector of an electronic control unit of the vehicle;

at least two terminals mounted on the card and electrically and operably connected between wires of the first and second cables, the at least two terminals for connecting the card to a digital volt/ohm meter; and a light mounted on the card and electrically and operably connected between wires of the first and second cables to determine and visually indicate whether the proper voltage is being received by the throttle position sensor.

2. The harness of claim 1, the first cable comprising a plurality of other ends, each of the other ends terminating in and operably attached to a different connector, wherein each of the different connectors of the first cable is sized and shaped to be removably connectable to a different throttle position sensor connector.

3. The harness of claim 2, the second cable comprising a plurality of other ends, each of the other ends terminating in and operably attached to a different connector, wherein each of the different connectors of the second cable is sized and shaped to be mated with only one of the different connectors of the first cable.

4. The harness of claim 1, the wires of the first and second cable comprising a supply voltage line and a reference voltage line, wherein one terminal is operably connected to the supply voltage line and the other terminal is operably connected to the reference voltage line.

5. The harness of claim 1, the multiple wires of the first and second cable comprising a supply voltage line, a reference voltage line and a ground line, the light being electrically and operably connected between the supply voltage line and the ground line.

6. The harness of claim 1, wherein the connector of the first cable comprises either a plug or receptacle connector.

7. The harness of claim 1, wherein the connector of the second cable comprises either a plug or receptacle connector.

8. A multi-end wire harness for use with at least a first throttle position sensor of a first vehicle and second throttle position sensor of a second vehicle, the first and second throttle position sensors each having a unique connector, the multi-end wire harness comprising:

a card;

a first cable having multiple wires therein and a plurality of ends, at least one end being hard-wired to the card, at least a second end terminating in and operably attached to a first connector, the first connector being sized and shaped to be removably connected to the first throttle position sensor connector, and at least a third end terminating in and operably attached to a second connector, the second connector being sized and shaped to be removably connected to the second throttle position sensor connector; and a second cable having multiple wires therein and a plurality of ends, at least one end being hard-wired to the card, at least a second end terminating in and operably attached to a first connector, the first connector of the second end of the second cable being a mate for the first connector of the second end of the first cable, the first connector of the second end of the second cable being removably connectable to a connector of an electronic control unit of the first vehicle, and at least a third end terminating in and operably attached to a second connector, the second connector of the third end of the second cable being a mate for the second connector of the third end of the first cable, the second connector of the third end of the second cable being removably connectable to a connector of an electronic control unit of the second vehicle;

whereby the multi-end wire harness can be used with at least the unique connectors of the first and the second vehicles.

9. The multi-end wire harness of claim 8, the first cable comprising a plurality of other ends, each of the other ends terminating in and operably attached to a different connector, wherein each of the different connectors is sized and shaped to be removably connectable to a different throttle position sensor connector.

10. The multi-end wire harness of claim 9, the second cable comprising a plurality of other ends, each of the other ends terminating in and operably attached to a different connector, wherein each of the different connectors is sized and shaped to be mated with only one of the different connectors of the first cable.

11. The multi-end wire harness of claim 8, the card further comprising at least two terminals mounted on the card and electrically connected between wires of the first and second cables for connecting the card to a digital volt/ohm meter.

12. The multi-end wire harness of claim 11, the wires of the first and second cable comprising a supply voltage line and a reference voltage line, wherein one terminal is operably connected to the supply voltage line and the other terminal is operably connected to the reference voltage line.

13. The multi-end wire harness of claim 8, the card further comprising a light mounted on the card and electrically connected between wires of the first and second cables for determining and visually indicating whether the proper voltage is being received by any of the throttle position sensors.

14. The multi-end wire harness of claim 13, the multiple wires of the first and second cable comprising a supply voltage line, a reference voltage line and a ground line, the light being electrically and operably connected between the supply voltage line and the ground line.

15. The multi-end wire harness of claim 8, wherein the connectors of the first cable comprise either plug or receptacle connectors.

16. The multi-end wire harness of claim 8, wherein the connectors of the second cable comprise either plug or receptacle connectors.

17. A multi-end wire harness for use with at least a first throttle position sensor of a first vehicle and second throttle position sensor of a second vehicle, the first and second throttle position sensors each having a unique connector, the multi-end wire harness comprising:

a card;

a first cable having multiple wires therein and a plurality of ends, at least one end being hard-wired to the card, at least a second end terminating in and operably attached to a first connector, the first connector being sized and shaped to be removably connected to the first throttle position sensor connector, and at least a third end terminating in and operably attached to a second connector, the second connector being sized and shaped to be removably connected to the second throttle position sensor connector;

a second cable having multiple wires therein and a plurality of ends, at least one end being hard-wired to the card, at least a second end terminating in and operably attached to a first connector, the first connector of the second end of the second cable being a mate for the first connector of the second end of the first cable, the first connector of the second end of the second cable being removably connectable to a connector of an electronic control unit of the first vehicle, and at least a third end terminating in and operably attached to a second connector, the second connector of the third end of the second cable being a mate for the second connector of the third end of the first cable, the second connector of the third end of the second cable being removably connectable to a connector of an electronic control unit of the second vehicle;

whereby the multi-end wire harness can be used with at least the unique connectors of the first and the second vehicles;

at least two terminals mounted on the card and electrically connected between wires of the first and second cables, the at least two terminals for connecting the card to a digital volt/ohm meter; and a light mounted on the card and electrically connected between wires of the first and second cables for determining and visually indicating whether the proper voltage is received by any of the throttle position sensors.

18. The harness of claim 17, the first cable comprising a plurality of other ends, each of the other ends terminating in and operably attached to a different connector, wherein each of the different connectors is sized and shaped to be removably connectable to a different throttle position sensor connector.

19. The harness of claim 18, the second cable comprising a plurality of other ends, each of the other ends terminating in and operably attached to a different connector, wherein each of the different connectors is sized and shaped to be mated with only one of the different connectors of the first cable.

20. The harness of claim 17, the wires of the first and second cable comprising a supply voltage line and a reference voltage line, wherein one terminal is operably connected to the supply voltage line and the other terminal is operably connected to the reference voltage line.

21. The harness of claim 17, the multiple wires of the first and second cables comprising a supply voltage line, a reference voltage line and a ground line, the light being electrically and operably connected between the supply voltage line and the ground line.

22. The harness of claim 17, wherein the connectors of the first cable comprise either plug or receptacle connectors.

23. The harness of claim 17, wherein the connectors of the second cable comprise either plug or receptacle connectors.

* * * * *